United States Patent [19]

Miyatake

[11] Patent Number: 5,218,193
[45] Date of Patent: Jun. 8, 1993

[54] DOUBLE-FOCUS MEASUREMENT APPARATUS UTILIZING CHROMATIC ABERRATION BY HAVING FIRST AND SECOND BODIES ILLUMINATED RESPECTIVELY BY A SINGLE WAVELENGTH RAY AND A RAY HAVING A PLURALITY OF WAVELENGTHS

[75] Inventor: Tsutomu Miyatake, Kiyose, Japan

[73] Assignee: Sumitomo Heavy Industries Co., Ltd., Japan

[21] Appl. No.: 832,372

[22] Filed: Feb. 7, 1992

[30] Foreign Application Priority Data

Feb. 16, 1991 [JP] Japan .................................. 3-42461

[51] Int. Cl.⁵ .............................................. G01J 1/20
[52] U.S. Cl. .................... 250/201.4; 356/401
[58] Field of Search ............... 250/561, 548, 201.4, 250/201.7, 491.1; 356/401, 400, 215

[56] References Cited

U.S. PATENT DOCUMENTS 5,004,348 4/1991 Magome ............................. 356/401
5,114,236 5/1992 Matsugu et al. ..................... 356/400

Primary Examiner—David C. Nelms
Assistant Examiner—Que T. Le
Attorney, Agent, or Firm—Ostrolenk, Faber, Gerb & Soffen

[57] ABSTRACT

A double-focus detector utilizing a lens system having axial chromatic aberration vertically illuminates a mask and a wafer disposed at a minute interval in the direction of the optical axis of the lens system. The mask is illuminated with a single ray of wavelength 500 nm or more and the wafer is illuminated with a given band flux or a plurality of rays of wavelength larger than that selected for the mask and one of focus planes of the lens system is an image forming plane of the single ray and the other focus plane of the lens system is the same image forming plane of the given band ray or the plurality of rays so that the relative position between the mask and the wafer can be detected.

2 Claims, 5 Drawing Sheets

WAVELENGTH (nm)
SiN FILM THICKNESS: 2μm
SPECTRAL TRASMISSIBILITY
OF SiN FILM

DOUBLE-FOCUS MEASUREMENT APPARATUS UTILIZING CHROMATIC ABERRATION BY HAVING FIRST AND SECOND BODIES ILLUMINATED RESPECTIVELY BY A SINGLE WAVELENGTH RAY AND A RAY HAVING A PLURALITY OF WAVELENGTHS

BACKGROUND OF THE INVENTION

The present invention relates to the improvement of an illumination method with band and multiple wavelength rays when a double-focus optical apparatus utilizing chromatic aberration is employed in a position detector such as an X-ray exposure apparatus.

The inventor of the present application has already proposed "an illumination method with multiple and band wavelength rays in a double-focus detector utilizing chromatic aberration" in the Japanese Laid-Open Patent Application No. 2-816, which will be described briefly in the following.

In a stepper such as an X-ray exposure apparatus, it is required to arranged a mask and a wafer in position with a high accuracy. However, the surface of a wafer for use in a stepper is covered with a resist film or a transparent film, the thickness of which is not uniform, and therefore the intensity of reflected rays of an alignment mark on the wafer varies sinusoidally by the standing wave effect to light interference to cause variation in a relative intensity between signal rays for detecting the alignment mark. As a result, accuracy of alignment is remarkably reduced.

Accordingly, the aforesaid proposal has disclosed the following measure to solve such problem. In a double-focus detector utilizing a lens system having axial chromtic aberration in which a mask mark and a wafer mark are detected at the same time, as one focus plane of the lens system, an image forming plane of a single wavelength ray which corresponds to a first body, for example, which is the mask is employed and as the other focus plane of the lens system, an image forming plane of a given band wavelength ray or multiple wavelength rays which correspond to a second body, for example, in which the wafer is employed. With such arrangement, the first body is illuminated by a single ray of 500 nm or less and second body is illuminated by two wavelength rays of 500 nm or more, or of a given band wavelength flux so that a reduction in an alignment accuracy which is caused by light interference due to unevenness in thickness of a resist film or the like can be prevented.

In other words, in the prior art, the detection is made such that respective rays for illumination the mask and the wafer are selected to use two kinds of rays a single ray and multiple rays of flux in a given band of wavelengths are on both sides of the 500 nm wavelength. Namely, in an X-ray mask having a simple structure, the detection is made by illuminating with a single ray of 500 nm or less and in the wafer to which a process treatment is applied, the detection is made simultaneously by illuminating with multiple rays or a flux band with wavelengths flux of 500 nm or more. The reason is that rays of 500 nm or more are adapted to the process treatment of the wafer. On the other hand, the X-ray mask is formed with a single thin film or membrane of uniform thickness and is not influenced in the least by the process as compared with the wafer, so that a ray of 500 nm or less can be sufficientty employed.

By the way, the X-ray mask is a self-supporting strained film (membrane) which is good for transmitting X-rays for exposure and visible rays or infrared rays for alignment. However, an experiment conducted by the present inventor indicates that this membrane has transmissibility for visible rays which depends upon the wavelength of a ray and when a mark on the X-ray mask is detected with a single wavelength ray, for example, a g ray of 436 nm, there are some cases where a sufficient contrast of an image is not obtained because of the low transmissibility of the g ray. FIG. 10 shows a spectral transmissibility when an SiN film of 2 μm thickness is employed as a membrane.

In FIG. 10, when the foregoing two kinds of ray are selected as rays for aligning the X-ray mask and the wafer, a spectral transmissibility of a ray to be used for detecting the X-ray mask on the short-wavelength side is about 0.1 and when such a ray is used for detection, a contrast of an image is largely reduced. Consequently, accuracy of detecting the position of the X-ray mask is significantly reduced, with the result that accuracy of detecting a relative position between the X-ray mask and the wafer is remarkably reduced.

To solve this problem, the following two methods are conceivable.

① A single ray of 500 nm or more having a high spectral transmissibility to the X-ray mask is employed as an alignment ray to illuminate the X-ray mask.

② A sufficient image contrast is obtained even with a ray of 500 nm or less whose spectral transmissibility is low, by controlling thickness of a membrane film of X-ray mask.

The method ② requires controlling a thichness of a membrane film which is made of Si N and is 1 μm to 6 μm thick. This is costly and results in a variety of restrictions in manufacturing. Consequently, the present invention adopts method ①, which is much better than method ② in reducing restrictions on the whole system and cost of manufacturing the X-ray mask.

SUMMARY OF THE INVENTION

In consideration of the aforesaid problem, the present invention has been designed, and an object thereof is to provide a double-focus apparatus utilizing chromatic aberration which results in superior accuracy when detecting a relative position between the X-ray mark and the wafer.

According to the present invention, an illumination method for use in a position detector which employs a lens system having axial chromatic aberration and detects a relative position between first and second bodies which are spaced by a minute interval in a direction of the optical axis of the lens system. The detector is characterized by having as one of the focus planes of the lens system, an image forming plane of a single wavelength ray for illuminating the first body which is employed and as the other focus plane, the same image forming plane for a flux in a band wavelength of for illuminating the second body which is employed, and said single wavelength ray is selected to have a wavelength of 500 nm or more and said flux in a band of wavelengths is selected to be a given band flux of wavelengths larger than that selected for said single ray.

In addition, according to the present invention, an illumination method for use in a position detector which employs a lens system having axial chromatic abrration and detects a relative position between first and second bodies which are separated by a minute interval along the optical axis of the lens system, is characterized in that as one of focus planes of the lens system, an image forming plane of a single wavelength ray for illuminating the first body which is employed and as the other focus plane, the same image forming plane for a plurality of wavelength rays for illuminating the second body which is employed, and said single wavelength ray is selected to have a wavelength of 500 nm or more and said plurality of wavelength rays are selected to have a plurality of wavelengths larger than that selected for said single ray.

According to the present invention, when the X-ray mask and the wafer are detected by illuminating with a single wavelength ray and a band wavelength flux or a plurality of rays, of 500 nm or more, respectively, it is possible to eliminate restrictions on the detection of the X-ray mask with a single wavelength ray and provide an alignment apparatus for detecting a relative position between the first and second bodies which has a stable and high detection resolving-power is contrast. In this case, the detection resolving-power is the order of 0.01 $\mu$m.

In addition, according to the present invention, in any X-ray mask presently being manufactured, a sufficiently high contrast in an image can be obtained, so that the X-ray mask can be freely made without being restricted by conditions for making an alignment apparatus. Since there is no restriction for the alignment apparatus, it is possible to enhance accuracy for making the X-ray mask and to reduce its cost.

Furthermore, according to the present invention, any X-ray mask can have a stabilizing effect on detection with a high contrast, so that reliability of an X-ray exposure apparatus and a productivity, such as a throughput, can be largely improved.

DETAILED DESCRIPTION OF THE PREFERRED EMBODIMENT

Figure 5:
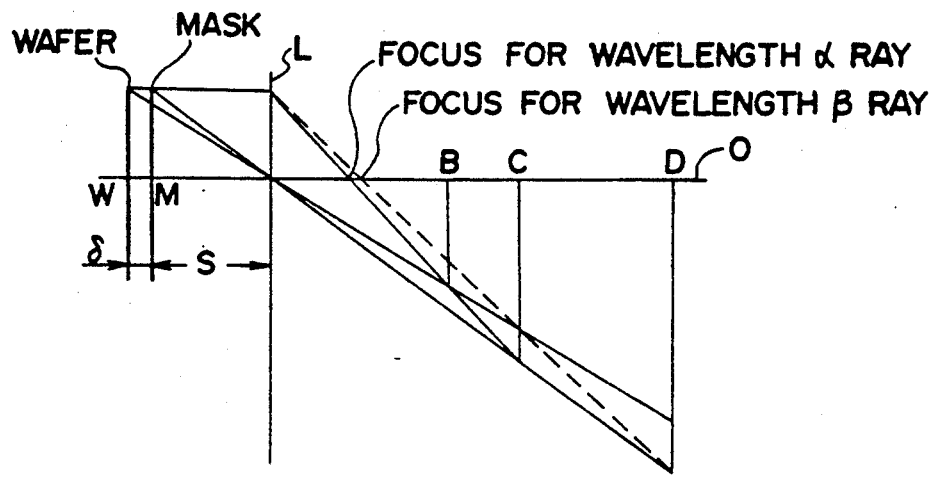
FIG. 5 is an optical path diagram showing an image forming state of an objective lens at the paraxial region thereof, for explaining an axial chromatic aberration.
Figure 6:
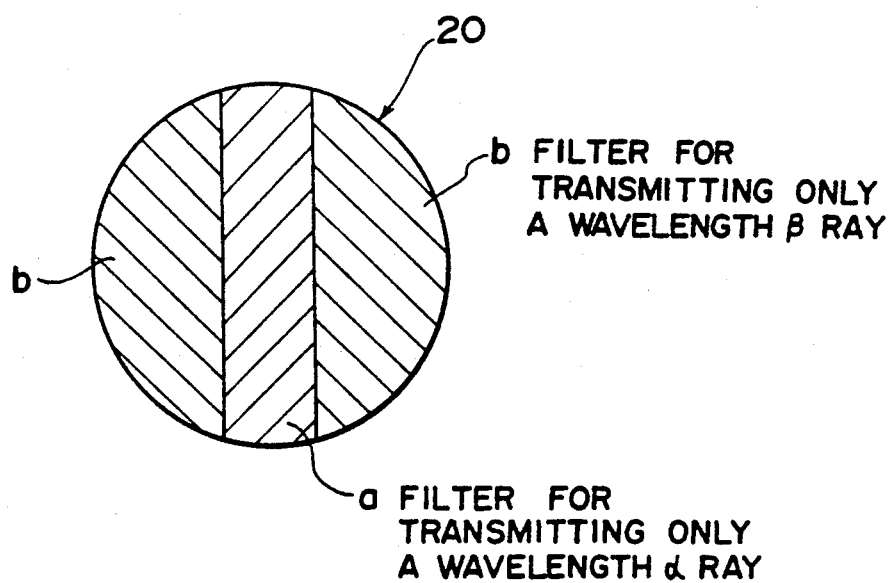
FIG. 6 is a front view of a conventional pattern barrier filter.

First, a double-focus apparatus utilizing axial chromatic aberration to which the present invention is applied will be described briefly with particular reference to FIG. 5 which diagrams an image forming state of an objective lens at the paraxial region thereof. An X-ray mask M is disposed in front of an objective lens L by distance S on the optical axis O of the objective lens L and a wafer W is disposed at a minute interval $\delta$ in front of the X-ray mask M. Now assuming that an amount of axial chromatic aberration of the objective lens L to two rays of different wavelengths $\alpha$, $\beta$ equalizes to the interval $\delta$ between the X-ray mask M and the wafer W, images of the X-ray mask M to two rays of wavelengths $\alpha$, $\beta$ are formed respectively at the points B and C on the optical axis O, whereas images of the wafer W to the two rays are formed respectively at the points C and D on the optical axis O. That is, images of the X-ray mask M to the ray of wavelength $\beta$ and of the wafer W to the ray of wavelength $\delta$ take the same position at the point C on the optical axis O. Accordingly, an optical system which has two object planes and one common image plane on the same optical axis is realized. On the other hand, light fluxes which form images at the points B and D on the optical axis O reduce a resolution by superposing on a required image formed at the point C. Therefore, to cut light fluxes which form images at the point B and D, light fluxes unnecessary to form an image at the point C are removed by providing a specific pattern barrier filter 20 in front of the point C as shown in FIG. 6. Namely, the filter 20 is formed by a filter a for transmitting only the ray of wavelength $\alpha$ at the center portion thereof and filters b provided on both sides of the filter a for transmitting only the ray of wavelength $\beta$, such that by transmitting the wafer mask W through the region of the filter a and the X-ray mask M mark through the region of the filter b, both the marks can be clearly detected at the point C on the optical axis O at the same time and position.

Next, the principle of the illumination with a band wavelength flux or a plurality of wavelength rays will be described in the following.

Figure 7:
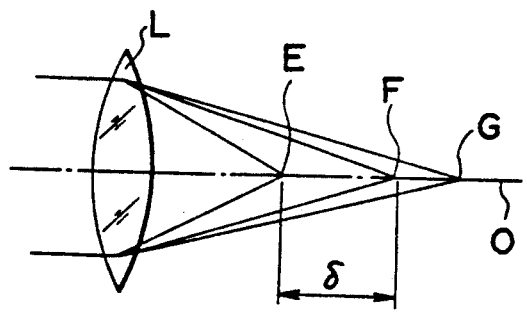
FIG. 7 is an optical path diagram showing an image forming state of an objective lens at the paraxial region thereof, also for explaining an axial chromatic aberration.
Figure 8:
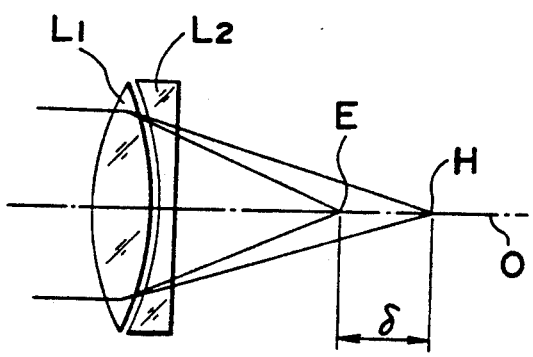
FIG. 8 is an optical path diagram showing an image forming state of an achromatic objective lens.

FIG. 7 shows an image forming state at the paraxial region of the objective lens L. In FIG. 7, parallel incident fluxes of wavelengths $\alpha$, $\beta$, $\gamma$ ($\alpha < \beta < \gamma$) form their images at foci E,F,G on the optical axis O, respectively. The interval between the points E and F is made equal to the interval $\delta$ between the X-ray mask M and the wafer W. In FIG. 7, when a correction of axial chromatic aberration similar to that of a normal achromatic lens is given to a convex lens $L_1$ and a concave lens $L_2$, as shown in FIG. 8, the foci F and G for the rays of wavelengths $\beta$ and $\gamma$ coincide with each other at the point H on the optical axis O to present the state shown in FIG. 8. At this time, the interval between the points E and H is designed so as to be the interval $\delta$ between the X-ray mask M and the wafer W.

In FIG. 8, since images of the X-ray mask M and the wafer W coincide with each other at the image plane H, foci of wavelengths from $\beta$ to $\gamma$ coincide with one another, so that images of the X-ray mask M and the wafer W under illumination by flux in a band of wavelengths between $\beta$ to $\gamma$ or a plurality of rays of wavelengths $\beta$ to $\gamma$ can be formed at the same image point H. An achromatic condition to rays of wavelengths $\alpha$, $\beta$, $\gamma$ in FIG. 8 is given by the following equation.

$N_{1\beta}$: a refractive index of the lens $L_1$ to a ray of wavelength $\beta$, $N_{1\gamma}$: a refractive index of the lens $L_1$ to a ray of wavelength $\gamma$ $N_{2\beta}$: a refractive index of the lens $L_2$ to a ray of wavelength $\beta$, $N_{2\gamma}$: a refractive index of the lens $L_2$ to a ray of wavelength $\gamma$ Then, $f_\gamma = f_\beta - \delta$ $$\frac{\nu_1}{f_{1\beta}} + \frac{\nu_2}{f_{2\beta}} = 0$$

$$\nu_1 = \frac{N_{1\beta} - N_{1\gamma}}{N_{1\beta} - 1}$$

$$\nu_2 = \frac{N_{2\beta} - N_{2\gamma}}{N_{2\beta} - 1}$$

Figure 9:
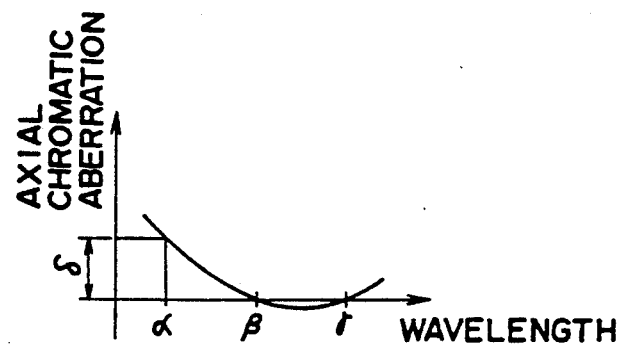
FIG. 9 is a graph showing characteristics of an axial chromatic aberration.
Figure 10:
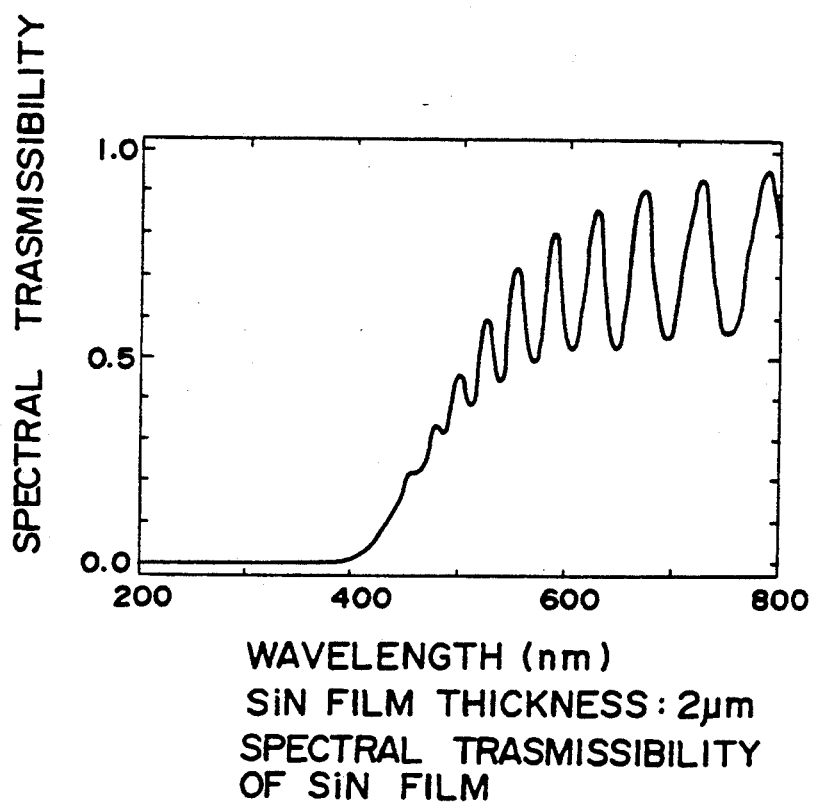
FIG. 10 is a diagram showing a spectral transmissibility curve of an SiN film.

In addition, characteristics of axial chromatic aberration of the lens system $L_1$ and $L_2$ in this case are shown in FIG. 9. A plurality of rays of wavelengths $\beta$ and $\gamma$ or a flux band of wavelengths $\beta$ to $\gamma$ is achromatized in a good manner.

By employing an optical system having axial chromatic aberration for which the aforesaid principle holds, in the foregoing prior art, a single wavelength ray of wavelength 500 nm or less and a plurality of rays or a flux band of wavelengths 500 nm or more for illuminating the X-ray mask and the wafer are employed to detect the X-ray mask with the single ray and the wafer with the plurality of rays or the given flux band, thus alignment rays of the X-ray mask and the wafer mask being separated by the boundary of wavelength 500 nm on opposite sides thereof.

Accordingly, the present invention differs from the foregoing prior art in that both illuminating rays for detecting the X-ray mask and the wafer have wavelengths larger than 500 nm.

Now, the present invention will be described hereinafter with particular reference to FIG. 1 which is a schematic structural diagram of an alignment optical system for detecting the X-ray mask and the wafer which are disposed at a minute interval with a double-focus apparatus having chromatic aberration. An X-ray mask 9 having a Ta mask and a wafer 10 having a wafer mark are horizontally mounted on respective stages in parallel at minute interval $\delta$ therebetween. An objective lens 8 in the double-focus detector having axial chromatic aberration is a lens system having an axial chromatic aberration characteristic as shown in FIG. 9. A ray of wavelength $\alpha$ vertically illuminates the X-ray mask 9 through a half mirror 4 and the objective lens 8, which ray is emitted from a light source 7, for example, a superhigh mercury-arc lamp, and passes through a filter 6a to form a single wavelength ray of wavelength 500 nm or more which is a sufficiently narrow ray whose half-width is about 8 nm, that is, an e ray of $\alpha = 543$ nm. On the other hand, the wafer 10 is vertically illuminated by flux in a band of wavelengths $\beta$ to $\gamma$ which is formed by passing a flux emitted from the light source 7 through a filter 6b, or a plurality of rays of wavelengths $\beta$ [$\beta = 587$ nm (d ray)] and $\gamma$ ($\beta < \gamma$) through the half mirror 4 and the objective lens 8.

The band of flux in ray having wavelengths $\beta$ to $\gamma$ or the plurality of rays of wavelengths $\beta$ and $\gamma$ are in the wavelength zone that is larger than the single ray of wavelength $\alpha$ ($\alpha < \beta < \gamma$).

Figure 1:
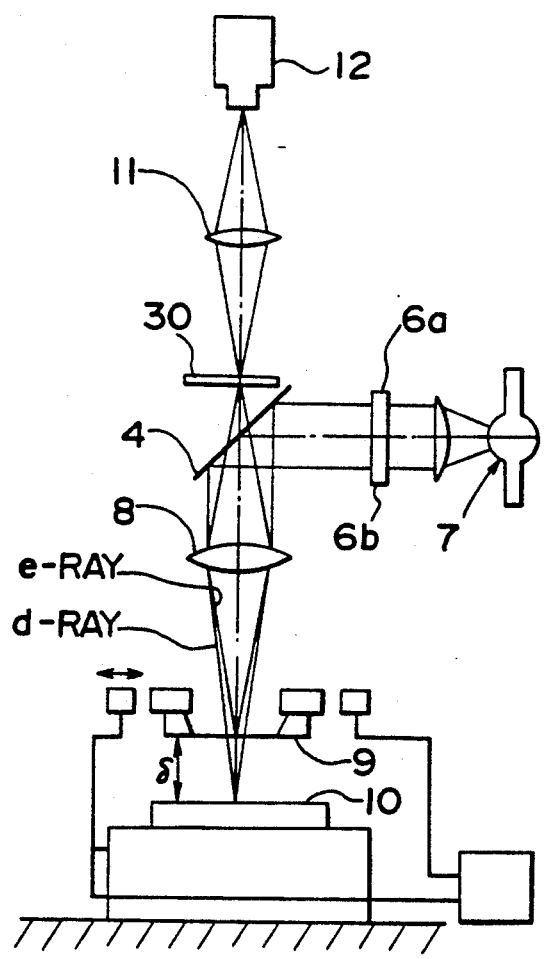
FIG. 1 is a schematic structural diagram of a double-focus apparatus utilizing chromatic aberration, with such apparatus embodying the present invention.
Figure 2:
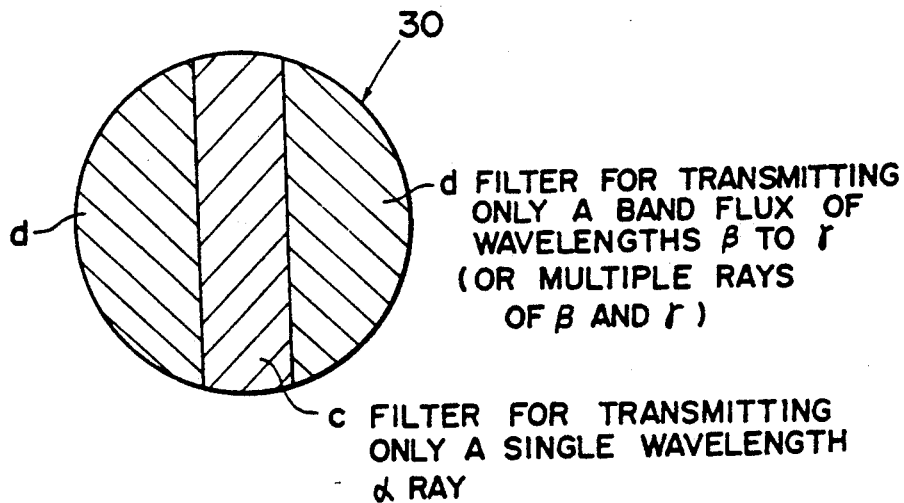
FIG. 2 is a front view of a pattern barrier filter which is used in the apparatus shown in FIG. 1.

FIG. 2 is a front view of a pattern barrier filter 30 that is used in the chromatic aberration double-focus apparatus of FIG. 1. A center portion C is a filter for transmitting only the single wavelength $\alpha$ ray and both sides d thereof are a filter for transmitting only the band flux of wavelengths $\beta$ to $\gamma$ or the plurality of rays of wavelengths $\beta$ and $\gamma$. The pattern barrier filter 30 differs from a conventional pattern barrier filter 20 shown in FIG. 6 in that the portions c and d are both shifted to a longer wavelength side.

Returning to FIG. 1, the X-ray mask 9 and the wafer 10 are illuminated respectively by a single ray of wavelength $\alpha$ and a band flux of wavelengths $\beta$ to $\gamma$ or a plurality of rays of wavelength $\beta$ and $\gamma$ to form images at the same position by the chromatic aberration objective lens 8. The pattern barrier filter 30 is disposed at the same image forming position or its vicinity to detect images of the X-ray mask 9 and the wafer 10 through a relay lens 11 with a TV camera 12, for example, at the same time.

The fact that restrictions on the X-ray mask are significantly reduced according to the present invention in the X-ray exposure will be described with reference to. X-ray lithography which has an ability of copying a pattern of quarter submicron and is considered to have a bright future as an exposure system of the coming generation. Therefore, to put the X-ray lithography into practice, the development of an SR ring, an SR stepper, an X-ray mask and a resist are being promoted. In an X-ray lithography for copying a pattern of quarter submicron with equal magnification, accuracy in manufacturing the X-ray mask should be very high.

An accuracy of superposing an exposure line is generally defined as a quarter in width thereof and an accuracy of 0.06 $\mu$m is required to an exposure line of width 0.25 $\mu$m. Here, the superposing accuracy includes accuracies such as for manufacturing the X-ray mask and positioning an X/Y stage. Accordingly, to raise accuracies it is essential to improve superposing accuracy.

By the way, an accuracy of manufacturing the X-ray mask is 0.05 $\mu$m to 0.1 $\mu$m in level which is published recently and further improvement is hoped. To this end, a variety of devices are being considered. In this situation, apparently it is not advisable to increase restrictions on the X-ray mask. A problem which can be settled in an alignment apparatus should be solved on the side of alignment apparatus. Hindering the improvement of accuracy for the X-ray mask by imposing restrictions on making the X-ray mask, leads to a big deficiency even to the whole X-ray lithography. From this point, the fact that the single ray and the band flux or the plurality of rays are all shifted to the longer wavelength side in the present invention is of deep significance.

Figure 3:
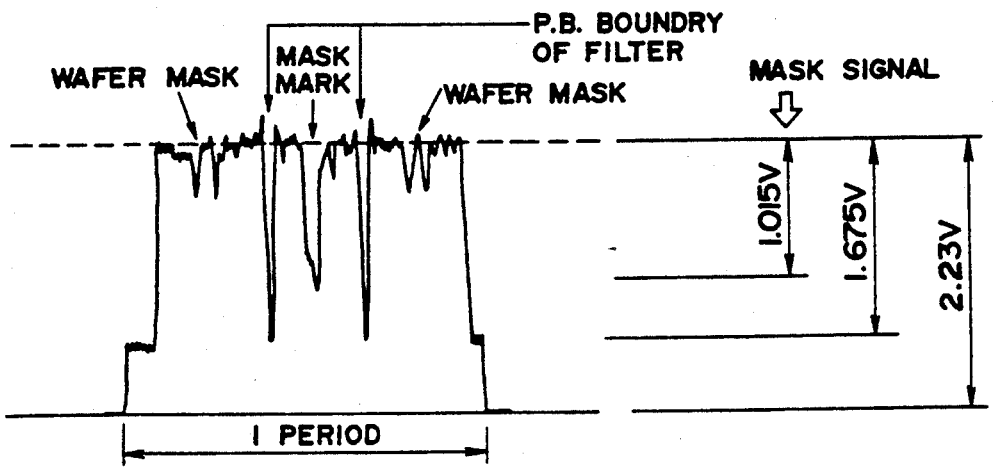
FIG. 3 is a single waveform diagram when illumination with a flux band of wavelengths including an e ray, is employed.
Figure 4:
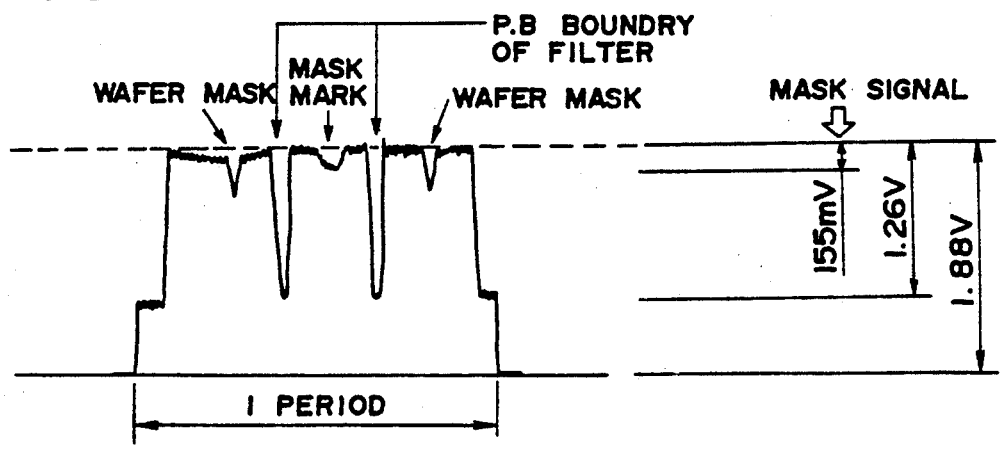
FIG. 4 is a single waveform diagram when illumation with a g ray is employed.

In FIG. 1, assuming that in the objective lens 8 there is, a numerical aperture (N.A)=0.37, a working distanse (W.D.)=28 mm, and a field size=0.3 mm $\phi$, an intervals between the X-ray mask 9 and the wafer 10 of 27 $\mu$m, and a magnification=100. Signal waveforms obtained by the TV camera 12 in the embodiment of the present invention where the X-ray mask 9 is illuminated with a single wavelength e ray, and the wafer 10 is illuminated with flux in a band of wavelengths 630 nm to 750 nm is shown in FIG. 3, and in the prior art where the X-ray mask 9 is illuminated with a single wavelength g ray is shown in FIG. 4.

While an intensity of an X-ray mask signal with illumination of g ray 0.155 V, a signal intensity with illumination of flux in a band of wavelengths is 1.015 V, thus signal intensity is improved 6.55 (1.015÷0.155) times. In addition, by comparison of contrast, $$g \text{ ray illumination} = \frac{0.155}{1.26 + 1.105} = 0.066$$

$$\text{Band flux illumination} = \frac{1.015}{1.675 + 0.66} = 0.435$$

Thus, the signal intensity is improved by 6.59 (0.435÷0.066) times.

By experiment, the present inventor has confirmed that if contrast is 0.2 or more, a resolving power for detection of 0.01 μm can be obtained. The mask contrast value=0.435 with illumination of a band flux including e ray is at the level offering no problem. On the other hand, the mask contrast value=0.066 with illumination of g ray is a third of the target contrast value 0.2 and in this case, the detection resolving power of 0.01 μm can not be expected. According to the experiment of the inventor, it is found that the detection resolving power with illumination of g ray is less than 0.14 μm.

While the foregoing description of the embodiment is the case where illumination with a band wavelength flux is employed, even in the case where illumination with a plurality of rays is employed, substantially the same result can be obtained. In addition, while the description is made regarding the case of an illumination method for an alignment apparatus in the X-ray exposure apparatus, it will be understood that the present invention is not limited to the foregoing case and is widely applicable to apparatus of this kind in which proximity exposure measurement, inspection or detection is required.

What is claimed is:

1. A method for illuminating first and second objects whose relative position is being detected by a position detector that includes a lens system having axial chromatic aberration, said first and second objects being spaced from each other by a minute interval measured along the optical axis of the lens system, said method including the steps of:

illuminating said first object with a first ray having a single wavelength;

employing as one focus plane of said lens system, an image forming plane for said first ray;

illuminating said second object with a second ray having a plurality of different wavelengths that constitute a band;

employing as another focus plane of said lens system, an image forming plane for said second ray;

selecting said first ray to have a wavelength of at least 500 nm, and selecting said second ray to have said plurality of different wavelengths that are longer than the wavelength selected for said first ray;

relatively positioning said first and second objects along said optical axis and selecting said wavelengths for said first and second rays so that said another focus plane coincides with said one focus plane.

2. A method for illuminating first and second objects whose relative position is being detected by a position detector that includes a lens system having axial chromatic aberration, said first and second objects being spaced from each other by a minute interval measured along the optical axis of the lens system, said method including the steps of:

illuminating said first object with a first ray having a single wavelength;

employing as one focus plane of said lens system, an image forming plane for said first ray;

illuminating said second object with a second ray having a plurality of discrete wavelengths;

employing as another focus plane of said lens system, an image forming plane for said second ray;

selecting said first ray to have a wavelength of at least 500 nm, and selecting said second ray to have said discrete wavelengths that are longer than the wavelength selected for said first ray;

relatively positioning said first and second objects along said optical axis and selecting said wavelengths for said first and second rays so that said another focus plane coincides with said one focus plane.

* * * * *